(12) United States Patent
Randolph et al.

(10) Patent No.: US 10,734,560 B2
(45) Date of Patent: Aug. 4, 2020

(54) CONFIGURABLE CIRCUIT LAYOUT FOR LEDS

(71) Applicant: Cree, Inc., Durham, NC (US)

(72) Inventors: David N. Randolph, Wake Forest, NC (US); Ryan C. Mohn, Cary, NC (US)

(73) Assignee: Cree, Inc., Durham, NC (US)

( * ) Notice: Subject to any disclaimer, the term of this patent is extended or adjusted under 35 U.S.C. 154(b) by 77 days.

(21) Appl. No.: 15/826,417

(22) Filed: Nov. 29, 2017

(65) Prior Publication Data

US 2019/0165229 A1 May 30, 2019

(51) Int. Cl.
| H01L 33/62 | (2010.01) |
| H01L 33/64 | (2010.01) |
| H01L 27/15 | (2006.01) |
| H05K 1/00 | (2006.01) |

(52) U.S. Cl.
CPC .............. *H01L 33/62* (2013.01); *H01L 27/15* (2013.01); *H01L 33/644* (2013.01); *H05K 1/00* (2013.01); *H01L 2933/0066* (2013.01)

(58) Field of Classification Search
CPC ....... H01L 33/62; H01L 33/644; H01L 27/15; H01L 2933/0066
See application file for complete search history.

(56) References Cited

U.S. PATENT DOCUMENTS

| 4,918,497 | A | 4/1990 | Edmond |
| 4,966,862 | A | 10/1990 | Edmond |
| 5,027,168 | A | 6/1991 | Edmond |
| 5,210,051 | A | 5/1993 | Carter, Jr. |
| 5,338,944 | A | 8/1994 | Edmond et al. |
| 5,359,345 | A | 10/1994 | Hunter |
| 5,393,993 | A | 2/1995 | Edmond et al. |
| 5,416,342 | A | 5/1995 | Edmond et al. |
| 5,523,589 | A | 6/1996 | Edmond et al. |
| 5,604,135 | A | 2/1997 | Edmond et al. |
| 5,631,190 | A | 5/1997 | Negley |
| 5,739,554 | A | 4/1998 | Edmond |
| 5,912,477 | A | 6/1999 | Negley |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,600,175 | B1 | 7/2003 | Baretz et al. |
| 6,791,119 | B2 | 9/2004 | Slater et al. |
| 6,853,010 | B2 | 2/2005 | Slater et al. |
| 6,958,497 | B2 | 10/2005 | Emerson et al. |

(Continued)

*Primary Examiner* — Thanhha S Pham
(74) *Attorney, Agent, or Firm* — Jenkins, Wilson, Taylor & Hunt, P.A.

(57) ABSTRACT

A device for an LED has a substrate and a circuit on the substrate configured to accept the LED. The circuit includes a first set of electrical traces terminating at a first set of solder pads for a first sized LED, a second set of electrical traces terminating at a second set of solder pads for a second sized LED different from the first sized LED, and peripheral electrical traces for electrically interconnecting electrical traces of the first set of electrical traces or between electrical traces of the second set of electrical traces. Connection components electrically interconnect the first set of electrical traces with each other or the electrical traces of the second set of electrical traces with each other, respectively, at corresponding solder pads. The device is configurable to provide a first voltage and a second voltage to the LED.

18 Claims, 11 Drawing Sheets

(56) References Cited

U.S. PATENT DOCUMENTS

| | | |
|---|---|---|
| 7,095,056 B2 | 8/2006 | Vitta et al. |
| 7,213,940 B1 | 5/2007 | Van de Ven et al. |
| 7,456,499 B2 | 11/2008 | Loh et al. |
| 7,564,180 B2 | 7/2009 | Brandes |
| 8,729,589 B2 | 5/2014 | Hussell et al. |
| 8,866,410 B2 | 10/2014 | Negley et al. |
| 8,970,131 B2 | 3/2015 | Brandes et al. |
| 9,131,561 B2 | 9/2015 | Athalye |
| 9,277,605 B2 | 3/2016 | Ni |
| 9,414,454 B2 | 8/2016 | Brandes et al. |
| 9,653,671 B2 * | 5/2017 | Munding ............... H01L 27/15 |
| 9,713,211 B2 | 7/2017 | Van de Ven |
| 2006/0221272 A1 | 10/2006 | Negley et al. |
| 2007/0104828 A1 | 5/2007 | Fornaguera |
| 2007/0139923 A1 | 6/2007 | Negley et al. |
| 2007/0158668 A1 | 7/2007 | Tarsa et al. |
| 2007/0170447 A1 | 7/2007 | Negley et al. |
| 2007/0223219 A1 | 9/2007 | Medendorp, Jr. et al. |
| 2007/0253209 A1 | 11/2007 | Loh et al. |
| 2008/0012036 A1 | 1/2008 | Loh et al. |
| 2008/0121921 A1 | 5/2008 | Loh et al. |
| 2008/0173884 A1 | 7/2008 | Chitnis et al. |
| 2008/0179611 A1 | 7/2008 | Chitnis et al. |
| 2008/0198112 A1 | 8/2008 | Roberts |
| 2008/0308825 A1 | 12/2008 | Chakraborty et al. |
| 2009/0050907 A1 | 2/2009 | Yuan et al. |
| 2009/0050908 A1 | 2/2009 | Yuan et al. |
| 2009/0080185 A1 | 3/2009 | McMillan |
| 2009/0184616 A1 | 7/2009 | Van de Ven et al. |
| 2015/0257211 A1 | 9/2015 | Johnson et al. |

* cited by examiner

CONFIGURABLE CIRCUIT LAYOUT FOR LEDS

TECHNICAL FIELD

The present subject matter relates generally to light emitting devices, systems, and methods. More particularly, the subject matter disclosed herein relates to devices and circuitry for mounting light emitting devices or diodes (LEDs) to a substrate to provide a plurality of configurations from a single substrate.

BACKGROUND

LEDs are used in a wide variety of applications. In the manufacture of LEDs, it is common to produce "families" of LED components which have characteristics that are similar in some ways, while varying in others. For example, a given family of LED devices may have comparable body shapes, encapsulants, and viewing angles, while offering a luminous output which increases proportionally with a footprint size of the device. This creates a selection of products to anticipate customer desires. However, although devices within a family may be comparable, specialized circuit board designs are traditionally required for each unique part in the series, given the geometric differences between devices within a family. For example, as the footprint size of an LED increases, larger and/or more widely spaced circuit pads are needed for electrical communication. Likewise, higher voltages may be needed for increased luminous output, which in turn may require changes in the electrical trace pattern. It has therefore traditionally been necessary to design and stock a separate stock-keeping unit, or SKU, for each circuit layout required by each device in the family.

There is a manufacturing cost associated with producing and managing the inventory of each SKU. As such, a need exists for minimizing the number of SKUs needed, while still providing a full range of product offerings to cover customer needs. According to the devices and methods described herein, this can be accomplished by providing a circuit layout that is configurable to accommodate a plurality of different sizes of LED devices and two different supply voltages. This reduces, for example, four different SKUs into a single SKU.

SUMMARY

LED circuitry and related methods are provided and described herein. Devices, components, and methods described herein can advantageously exhibit improved processing times, ease of manufacture, and/or lower processing costs. Devices, components, and related methods described herein are well suited for a variety of applications such as personal, industrial, and commercial lighting applications including, for example, light bulbs and light fixture products and/or applications. In some aspects, devices, components, and related methods described herein can comprise improved LED manufacturing processes and compact mounting footprints.

In some aspects, an LED circuit layout can have a device for a light emitting diode (LED) is provided. In this aspect, the device comprises a substrate and a circuit disposed on the substrate and configured to accept the LED. The circuit comprises: a first set of electrical traces, at least some of which terminate at a first set of solder pads configured for electrical connection to a first sized LED; a second set of electrical traces, at least some of which terminate at a second set of solder pads configured for electrical connection to a second sized LED that is a different size from the first sized LED; a plurality of peripheral electrical traces for providing electrical interconnection between electrical traces of the first set of electrical traces or between electrical traces of the second set of electrical traces, wherein the plurality of peripheral electrical traces comprise a plurality of peripheral solder pads for mounting connection components to provide the electrical interconnection between the electrical traces of the first set of electrical traces or between the electrical traces of the second set of electrical traces, respectively. The device is configurable to provide a first voltage and a second voltage to the LED.

In another aspect, a system for attaching a plurality of LEDs is provided. According to this aspect, the system comprises: a substrate and a plurality of circuits that are arranged on an upper surface of the substrate and configured to accept a respective one of the plurality of LEDs. Each of the plurality of circuits comprises: a first set of electrical traces, at least some of which terminate at a first set of solder pads configured for electrical connection to a first sized LED; a second set of electrical traces, at least some of which terminate at a second set of solder pads configured for electrical connection to a second sized LED that is a different size from the first sized LED; and a plurality of peripheral electrical traces for providing electrical interconnection between electrical traces of the first set of electrical traces or between electrical traces of the second set of electrical traces, wherein the plurality of peripheral electrical traces comprise a plurality of peripheral solder pads for mounting connection components to provide the electrical interconnection between the electrical traces of the first set of electrical traces or between the electrical traces of the second set of electrical traces, respectively. In this aspect, system is configurable to provide a first voltage and a second voltage to each of the plurality of LEDs.

In still another aspect, a method for connecting one of a plurality of differently sized light emitting diodes (LEDs) on a substrate is provided. According to this aspect, the method comprises providing a circuit which comprises: a first set of electrical traces, at least some of which terminate at a first set of solder pads configured for electrical connection to a first sized LED; a second set of electrical traces, at least some of which terminate at a second set of solder pads configured for electrical connection to a second sized LED that is different from the first sized LED, and a plurality of peripheral electrical traces for providing electrical interconnection between electrical traces of the first set of electrical traces or between electrical traces of the second set of electrical traces, wherein the plurality of peripheral electrical traces comprise a plurality of peripheral solder pads for mounting connection components to provide the electrical interconnection between the electrical traces of the first set of electrical traces or between the electrical traces of the second set of electrical traces, respectively. The method can further comprise: arranging and connecting the connection components to electrically interconnect the electrical traces of the first set of electrical traces or the electrical traces of the second set of electrical traces, respectively; connecting the first sized LED to the first set of solder pads or the second sized LED to the second set of solder pads; and supplying a first voltage or a second voltage to the first or second sets of electrical traces.

BRIEF DESCRIPTION OF THE DRAWINGS

A full and enabling disclosure of the present subject matter is set forth more particularly in the remainder of the specification, including reference to the accompanying, example figures, relating to one or more embodiments, in which.

DETAILED DESCRIPTION

Figure 1A:
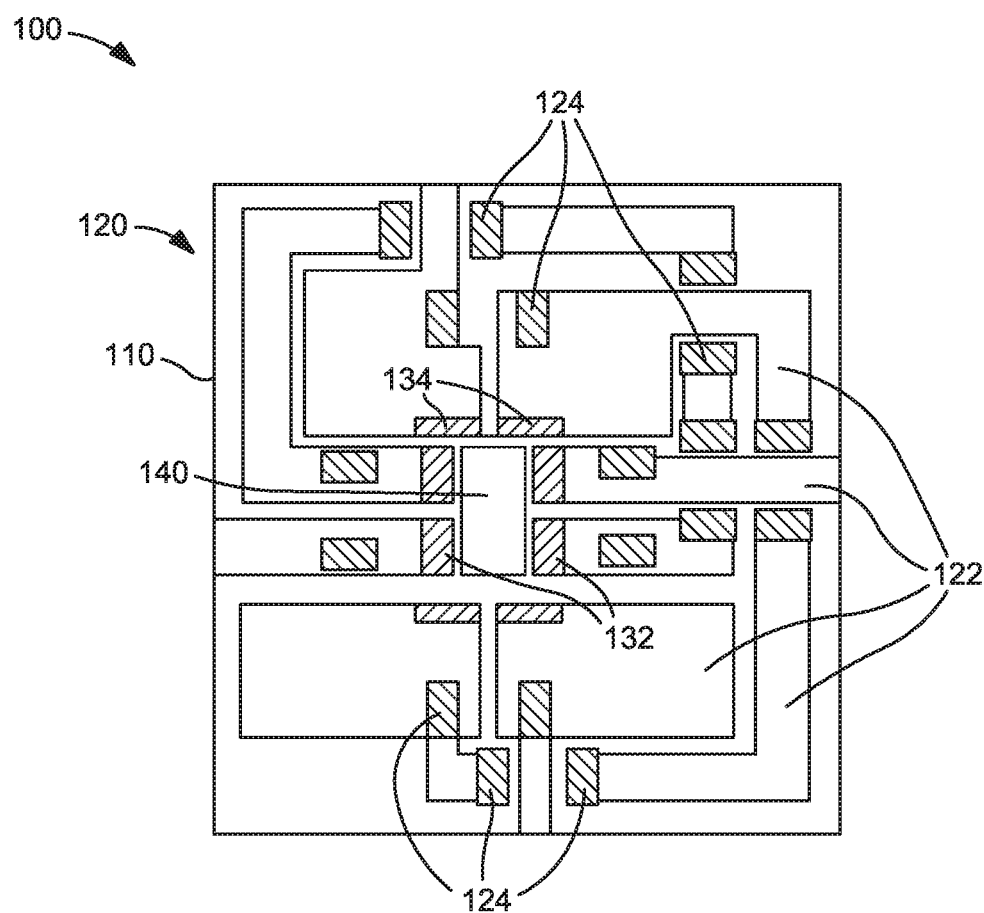
FIG. 1A is a top schematic view of an example embodiment of an LED circuit layout.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising", "including", and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common anode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Example substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic or metal boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

Phosphor and phosphor compounds as disclosed herein can in some aspects comprise one or more of a wide variety of wavelength conversion materials or color conversion components including luminescent materials. Examples of luminescent materials (lumiphors) include phosphors, Cerium-doped Yttrium Aluminum Garnet (YAG) (e.g. LuAG:Ce), Nitrides, Oxy-Nitrides, scintillators, day glow tapes, nanophosphors, quantum dots (e.g., such as provided by NNCrystal US Corp., Fayetteville, Ark.), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric matrix) arranged to cover or partially cover one or more solid state light emitters. One or more luminescent materials useable in devices as described herein may be down-converting or up-converting, or can include a combination of both types.

Wavelength conversion materials can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to embodiments of LED structures having a light source that comprises LEDs. The LED packages can be arranged in different ways and are relatively small, while at the same time are efficient, reliable and cost effective. The embodiments according to the disclosure herein can have different shaped encapsulants, and can emit light with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein is described with reference to example embodiments, but it is understood that the disclosure herein can be embodied in many different forms and should not be construed as limited to the embodiments set forth herein. In particular, the disclosure herein is described below in regards to certain LED apparatuses having LEDs in different configurations, but it is understood that the disclosure herein can be used for many other LED packages with other LED configurations. LED packages using the disclosure herein can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A mesa between the LEDs and on the common substrate can extend to certain layers or can extend all the way to or from the common substrate. Therefore, a monolithic LED can comprise more than one LED junctions on a common substrate, and the gaps between the LEDs can be formed by the mesas that can at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

Coatings, encapsulants, encapsulant layers, and the like are disclosed herein and can comprise any material that provides mechanical, chemical, and/or environmental protection to a substrate, reflective layer, or other LED component. A coating, encapsulant and/or encapsulant layer can be configured in some embodiments as a layer that covers a substantially horizontal or vertical surface, and in some aspects can comprise a layer disposed on top of another layer, surface or structure whether or not it fully surrounds all sides of the other layer, surface or structure. In some embodiments a coating, encapsulant and/or encapsulant layer can comprise or consist of a dielectric as disclosed herein. It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

Coating materials disclosed herein can in some aspects comprise a number of encapsulating layers, coatings and/or dielectric materials and compounds, including for example silicon oxide, silicon nitride, aluminum oxide, titanium dioxide, non-metallic oxides, non-metallic nitrides, tantalum oxide, aluminum, nickel, titanium, tungsten, platinum, combinations thereof or alloys thereof, etc. In some aspects such encapsulants, coatings and/or dielectrics can comprise one or more materials arranged to provide desired electrical isolation and high thermal conductivity. For example, a dielectric can provide a desired electrical isolation between electrical traces and/or sets of solid state emitters. In some aspects, such substrates can comprise ceramic such as alumina ($Al_2O_3$), aluminum nitride (AlN), silicon carbide (SiC), silicon, or a plastic or polymeric material such as polyimide, polyester, metal, etc.

Referring to FIG. 1A, an example embodiment of an LED circuit layout, generally designated 100, which is configured to have components placed thereon in different arrangements to provide a plurality of different voltages to a plurality of differently sized LED components is illustrated. Circuit layout 100 includes a substrate 110 and a circuit, generally designated 120, which is formed on or adjacent to a top surface of substrate 110. In some embodiments, substrate 110 can have a single electrically conductive layer. In other embodiments, substrate 110 can be a multi-layer board, including a printed circuit board (PCB) with multiple electrically conductive layers sequentially arranged within an interior of substrate 110. Circuit 120 comprises a plurality of electrically conductive traces 122. Electrical traces 122 are formed on the surface of substrate 110 and, unless electrically connected by a designated component, are electrically isolated from one another. Electrical traces 122 can be covered, at least partially, by a solder mask, while some regions remain exposed to form solder surfaces (e.g., 124, 132, 134). In some embodiments, electrical traces 122 can be substantially uncovered through the top surface of substrate 110 (e.g., having no solder mask thereon). These solder surfaces can include, for example, peripheral solder pads 124 for creating electrical connections between pairs of electrical traces 122 (see, e.g., FIGS. 2-5), or centrally located soldering pads (see, 132, 134, FIGS. 1B-1C) for mounting LED devices (e.g., 130, 136, FIGS. 1B-1C). Circuit 120 includes a thermally conductive element 140 disposed at approximately the center of circuit 120. In some embodiments, thermally conductive element 140 may be directly connected (e.g., soldered) to a thermally conductive portion of an LED device to enhance thermal performance of such LED device.

Some of the electrical traces 122 are configured to provide suitable connection points for an LED of one of at least two different sizes. This grouping of electrical traces 122 can be described as a first set of traces 126 and a second set of traces 128. This is illustrated in FIGS. 1B-1C.

Figure 1B:
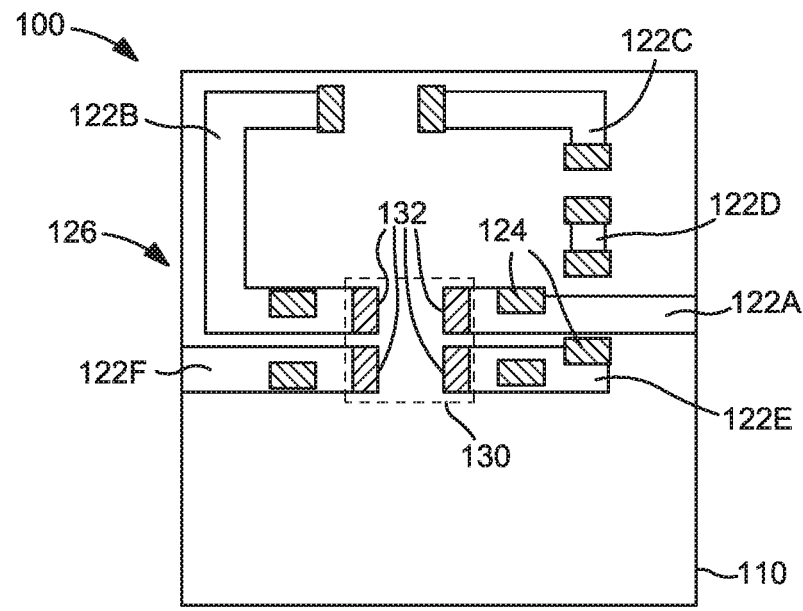
FIGS. 1B and 1C are partial schematic views of the embodiment of FIG. 1A.
Figure 1C:
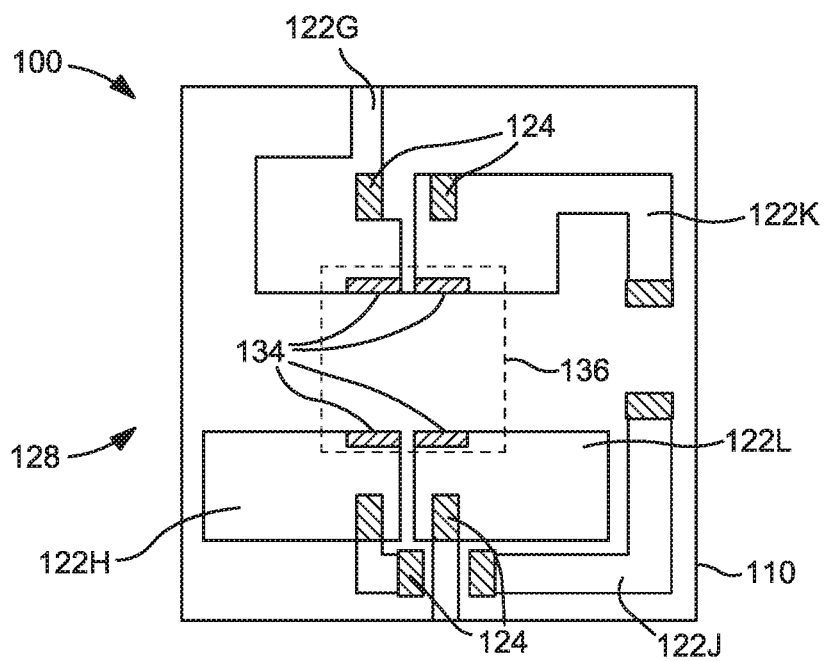

In FIGS. 1B-1C, and in accordance with aspects of the disclosure herein, the first and second sets of traces, generally designated 126 and 128, are illustrated. FIG. 1B is a partial view of circuit layout 100 shown in FIG. 1A, depicting only the first set of traces 126 and omitting the second set of traces to provide enhanced clarity of the electrical conduction path. A placement for first LED 130 is shown in broken lines, so that first set of traces 126 is not obscured. First set of traces 126 includes electrical traces 122A, 122B, 122E, and 122F, which terminate at a respective one of the first solder pads 132 that are arranged in a central region of circuit layout 100, and first and second peripheral electrical traces 122C and 122D of a plurality of such peripheral electrical traces, which each have two peripheral solder pads 124 arranged at the respective ends thereof. First set of traces 126 can be configured, according to this example embodiment, such that, in a first configuration, four traces (e.g., 122A, 122B, 122E, and 122F) are electrically interconnected to provide a first voltage to first LED 130 and, in a second configuration, six traces (e.g., 122A-F) are electrically interconnected to provide a second voltage to first LED 130. The opposite ends of electrical traces 122A-F, which make up first set of traces 126 can be configured in multiple ways and are described in more detail hereinbelow with respect to the example configurations illustrated in FIGS. 2 and 4. First solder pads 132 are configured to be connected to corresponding solder pads on first LED 130, which does not extend significantly over the adjacent electrical traces 122. In some embodiments, however, first LED 130 may be of a size that overlaps a portion of one or more of the adjacent electrical traces 122.

FIG. 1C is a second partial view of circuit layout 100 shown in FIG. 1A, in this case showing second set of traces 128. Second set of traces 128 includes electrical traces 122G, 122H, 122K, and 122L, which terminate in second solder pads 134, which are designed to accept a second LED 136, which is shown as a dashed line, and a third of the plurality of peripheral electrical trace 122J, which has two peripheral solder pads 124 arranged at the ends thereof for connection to electrical traces 122H and 122K, respectively. Second solder pads 134 are also disposed in a central region of circuit layout 100 and form a solder footprint that has a perimeter that is larger than the perimeter of the area collectively defined by first solder pads 132. Second set of traces 128 can be configured, according to this example embodiment, such that, in a third configuration, four traces (e.g., 122G, 122H, 122K, and 122L) are electrically interconnected to provide a first voltage to second LED 136 and, in a fourth configuration, five traces (e.g., 122G, 122H, 122J, 122K, and 122L) are electrically interconnected to provide a second voltage to second LED 136. Second LED 136 is a larger size than first LED 130, and second LED 136 extends across, but does not make electrical contact with, first solder pads 132. In this way a single circuit layout 100 can accommodate either of two different LEDs (e.g., 130 or 136) without the need for two different substrate assemblies to be manufactured and stored.

Circuit layout 100 can additionally be configured to provide one of a plurality of (e.g., two) voltages. The voltage delivered to the LED device is determined by a circuit path created by connecting one or more of the plurality of electrical traces 122 of the first or second sets of traces 126 and 128 to form one of the aforementioned first, second, third, or fourth configurations, depending on the desired voltage to be provided and the size of the LED device to be activated. It is thus unnecessary to adjust the voltage supplied by the external power source to achieve two possible voltages at the device. According to the desired interconnection of electrical traces 122 and the selective connecting between designated peripheral solder pads 124, multiple different voltages can be applied based on the electrical connection specification for the LED devices. In one example embodiment, both the first and second LEDs 130 and 136 may be configured to operate at 6V and/or 12V. Any suitable voltage multiples (e.g., 3V and 6V, 9V and 18V, etc.) may be selected. This is illustrated in the example configurations of circuit layout 100 shown in FIGS. 2-5.

Figure 2:
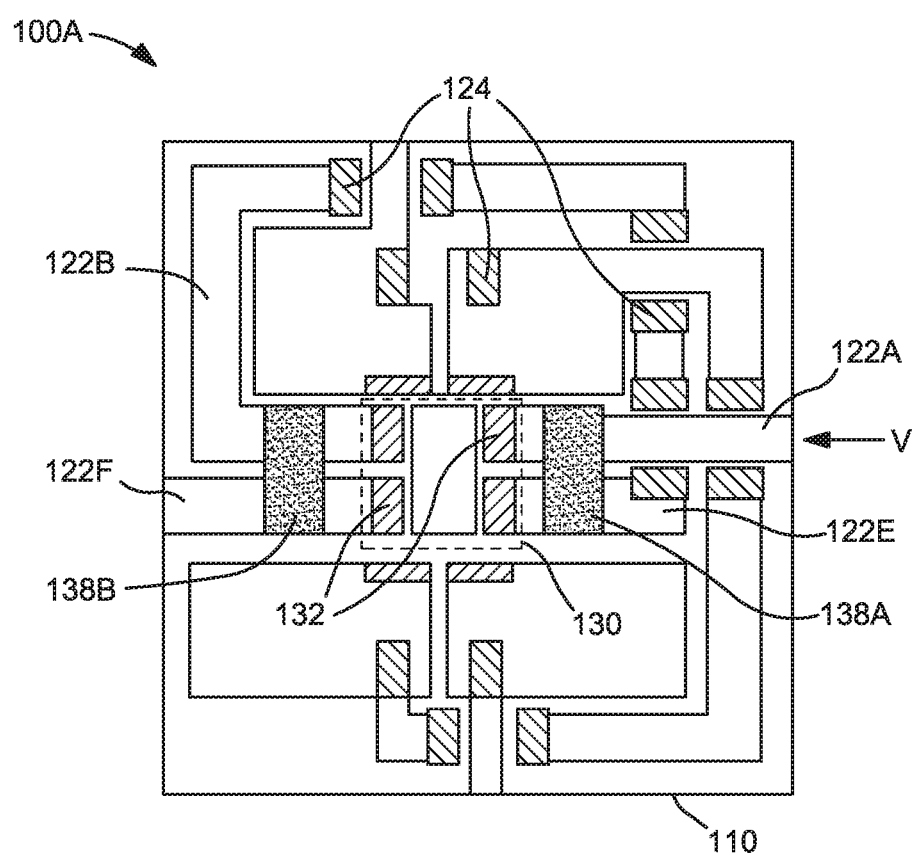
FIG. 2 is a schematic view of a first example configuration of the example embodiment of the LED circuit layout in FIG. 1.

Referring to FIG. 2, a first configuration of a configurable LED circuit layout, generally designated 100A, is illustrated. This first configuration is configured to drive first LED 130 (shown as a dashed line) at a first voltage, for example 6V. According to this embodiment, two connection components 138 are arranged to interconnect designated electrical traces 122 of the first set of traces 126. Connection components can be any suitable electrically conductive component, such as, for example, zero-ohm resistors, wire-bonds, jumpers, and the like. Connection components 138 form a "bridge" to provide an electrical interconnection between two electrical traces 122 that connect to an LED 130.

First LED 130 is mounted on and electrically connected to first solder pads 132 such that adjacent electrical traces 122 provide an input voltage. For example, as shown in FIG. 2, an input voltage V is supplied to an electrical trace 122A of the first set of traces 126. The voltage V is transferred to electrical trace 122B via connection component 138A, which is electrically connected (e.g., by soldering) between respective peripheral solder pads 124, in a parallel circuit to provide the same voltage V to LED 130 on both electrical traces 122A and 122E. Stated differently, connection component 138A electrically ties together (e.g., shorts) electrical traces 122A and 122E so that they are at a same voltage V. On the output (e.g., negative or ground) side, connection component 138B, which is electrically connected (e.g., by soldering) between respective peripheral solder pads 124, creates an electrical connection (e.g., a short circuit) between electrical traces 122B and 122D, such that electrical traces 122B and 122D are at a same voltage. Thus, first LED 130 receives a first voltage V at first solder pads 132. A voltage differential exists between electrical traces 122A, 122E and electrical traces 122B, 122F. In this embodiment, only the first set of traces 126 is utilized to form the active electrical circuit to power first LED 130.

Figure 3:
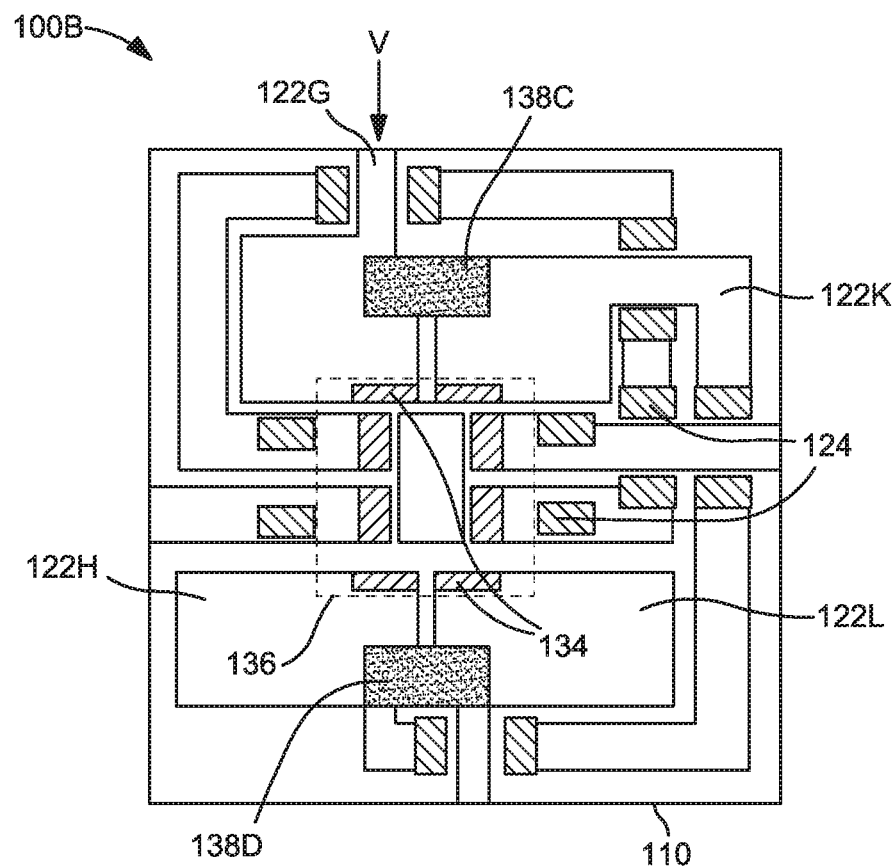
FIG. 3 is a schematic view of a second example configuration of the example embodiment of the LED circuit layout in FIG. 1.

In a similar alternative embodiment illustrated in FIG. 3, a second configuration of a configurable LED circuit layout, generally designated 100B, is shown to provide a voltage to a second LED 136. According to this example embodiment, two connection components 138 are electrically connected (e.g., by soldering) between respective peripheral solder pads 124 to interconnect respective electrical traces 122 of the second set of traces 128. As shown, an input voltage V is supplied to electrical trace 122G of the second set of traces 128 and connection component 138C is soldered to peripheral solder pads of electrical trace 122G and electrical trace 122K, such that these electrical traces are at the same voltage. Connection component 138D is soldered to peripheral solder pads 124 of electrical trace 122H to electrical trace 122L, such that they are at the same voltage. A voltage differential exists between electrical traces 122G, 122K and electrical traces 122H, 122L. This arrangement allows voltage V to be applied to second LED 136 through first solder pads 132. In this embodiment, only the second set of traces 128 is utilized to form the active electrical circuit to power second LED 136.

Figure 4:
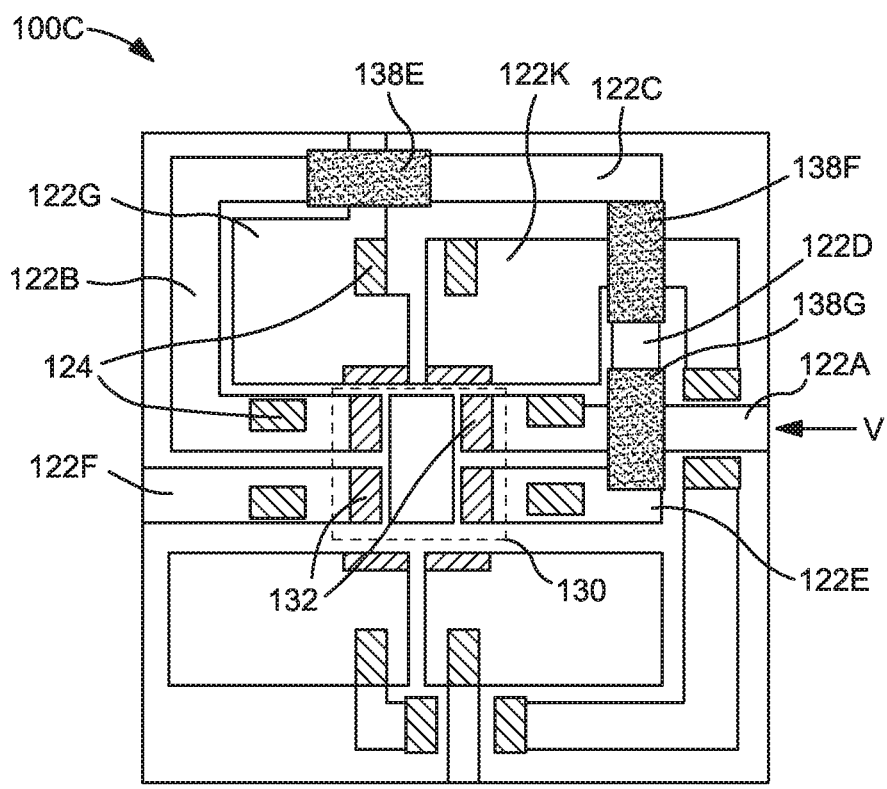
FIG. 4 is a schematic view of a third example configuration of the example embodiment of the LED circuit layout in FIG. 1.

Referring to FIG. 4, a third embodiment of a configurable circuit layout, generally designated 100C, is shown to provide a second voltage to a first LED 130. In this embodiment, a higher input voltage V is supplied to first LED 130 compared to the embodiment shown in FIG. 2. This higher voltage V (e.g., a multiple of the voltage applied in the embodiment of FIG. 2) is transmitted to electrical trace 122A, which is connected to provide this higher voltage V to first LED 130 at a first of the first solder pads 132. In this example embodiment, the current passes through LED 130 and exits through electrical trace 122B via a second of the first solder pads 132 connected thereto. Connection component 138E connects electrical trace 122B to electrical trace 122C, crossing over electrical trace 122G without connecting to it electrically. Such portions of electrical traces 122 may be covered with an electrically insulating material to avoid electrical contact with any of connection components 138. The current then flows, via connection component 138F, from electrical trace 122B to electrical trace 122D without electrically contacting electrical trace 122K of the second set of traces 128. Connection component 138G then bridges electrical trace 122D to electrical trace 122E, crossing over electrical trace 122A without connecting to it electrically. Voltage V then passes through LED 130 a second time, entering via a third of the first solder pads 132 disposed on electrical trace 122E, and exiting through a fourth of the first solder pads 132 disposed on electrical trace 122F. Other voltage configurations will be understood to be within the scope of the disclosure made herein to those of ordinary skill in the art based on the electrical connection characteristics of any given LED device.

Figure 5:
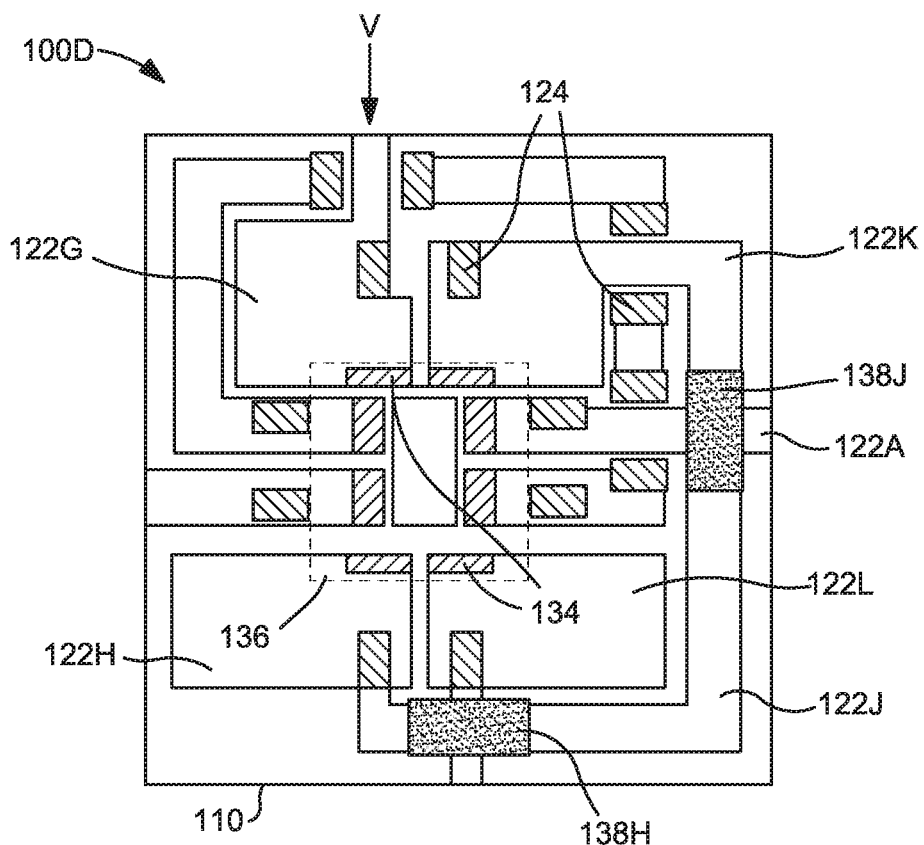
FIG. 5 is a schematic view of a fourth example configuration of the example embodiment of the LED circuit layout in FIG. 1.

Referring now to FIG. 5, a fourth embodiment of a configurable circuit layout, generally designated 100D, is shown to provide a second voltage to a second LED 136. In this embodiment, a higher input voltage V is supplied to second LED 136 compared to the embodiment shown in FIG. 3. This higher voltage V (e.g., a multiple of the voltage applied in the embodiment of FIG. 2) is transmitted to electrical trace 122G, which is connected to provide this higher voltage V to second LED 136 at a first of the second solder pads 134. The current passes through the second LED 136 and exits through electrical trace 122H via a second of the second solder pads 134. Connection component 138H connects electrical trace 122H to electrical trace 122J, crossing over electrical trace 122L without connecting to it electrically. Such portions of electrical traces 122 may be covered with an electrically insulating material to avoid electrical contact with any of connection components 138. Connection component 138J connects electrical trace 122J to electrical trace 122K, crossing over electrical trace 122A without connecting to it electrically. Voltage V then passes again through second LED 136 entering via a third of the second solder pads 134 disposed on electrical trace 122K, and exiting through a fourth of the second solder pads 134 disposed on electrical trace 122L. Other voltage configurations will be understood to be within the scope of the disclosure made herein to those of ordinary skill in the art based on the electrical connection characteristics of any given LED device In some aspects, for example, first LED 130 can be a square LED having a footprint of approximately 5 mm×5 mm, and second LED 136 can be a square LED having a footprint of 7 mm×7 mm. An input voltage for circuit layouts 100A and 1008 can be, for example, approximately 6V, which increases to approximately 12V in circuit layouts 100C and 100D.

Figure 6A:
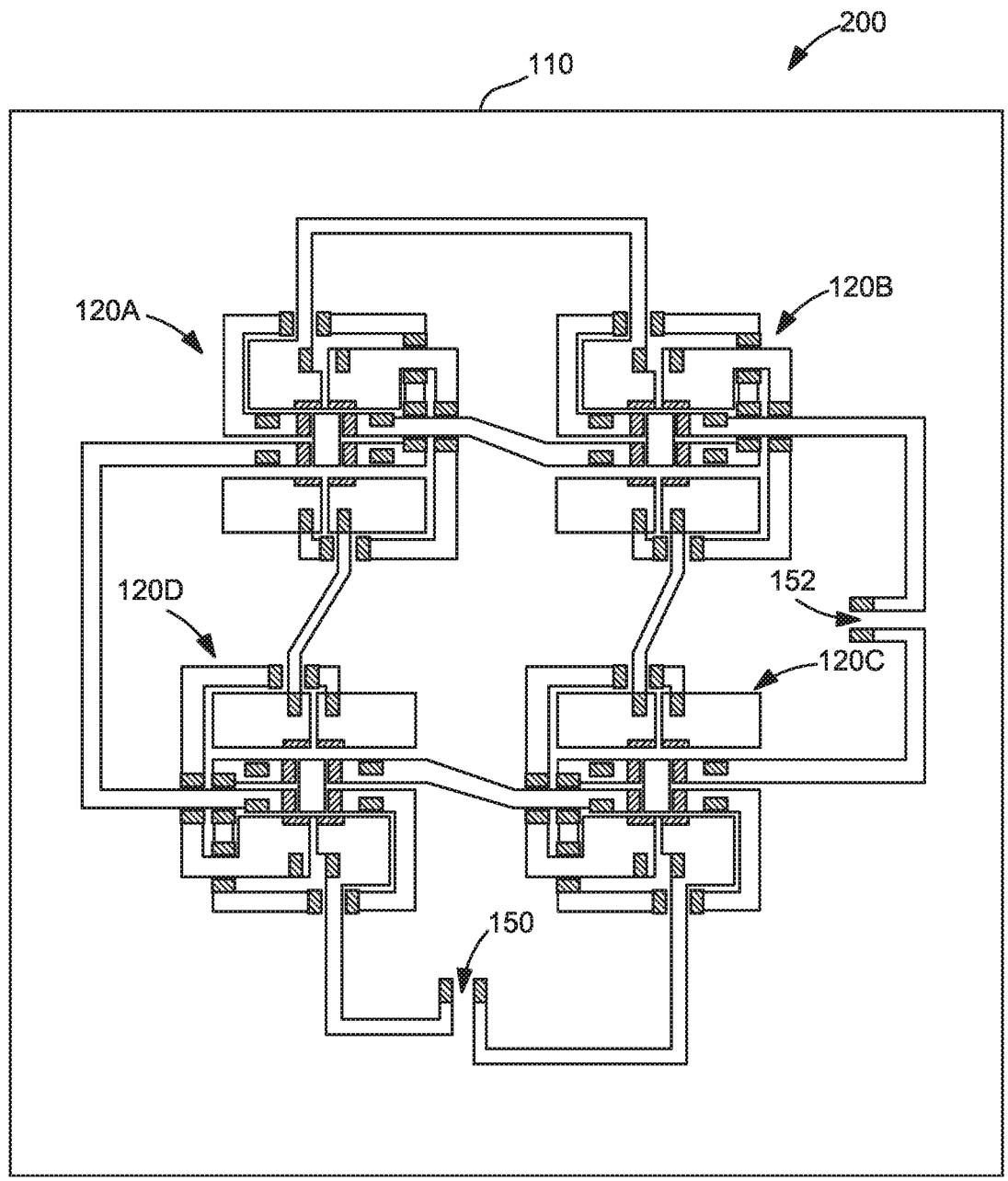
FIGS. 6A through 6E are top schematic views of respective configurations of a system having a plurality of LED circuit layouts of the example embodiment of FIG. 1.

As shown in FIG. 6A, a circuit system, generally designated 200, is shown. Circuit system 200 comprises a plurality of circuits, generally designated 120A-D, each of which is configurable with a plurality of possible layouts, and each of which have been illustrated and described in FIGS. 1A-1C. Each of these circuits 120A-D can be configured, as are respectively illustrated in FIGS. 6B through 6E, into one of the example embodiments of the configurable circuits shown and described in FIGS. 2-5. In the embodiment shown in FIG. 6A, circuit system 200 has at least first and second voltage connection terminals 150 and 152. In a non-limiting example, circuit system 200 can have circuits 120A-D which are arranged on a circuit board and electrically connected. Circuits 120A-D can be rotated (see, e.g., circuits 120A and 120B, which are vertically mirrored with respect to circuits 120C and 120D) to align electrical traces (see, e.g., 122, FIGS. 6B-6E) for a preferred voltage and/or current path. As shown in FIGS. 6B-6E, each of the circuits 120A-D comprises a plurality of electrical traces 122 that are electrically isolated from each other electrical trace in the same circuit 120A-D, but share electrical continuity with at least one other electrical trace 122 of an adjacent circuit 120A-D. Each of the circuits 120A-D in this embodiment are connected to each other in a series arrangement, but other circuit connections (e.g., parallel) are contemplated as well.

Figure 6B:
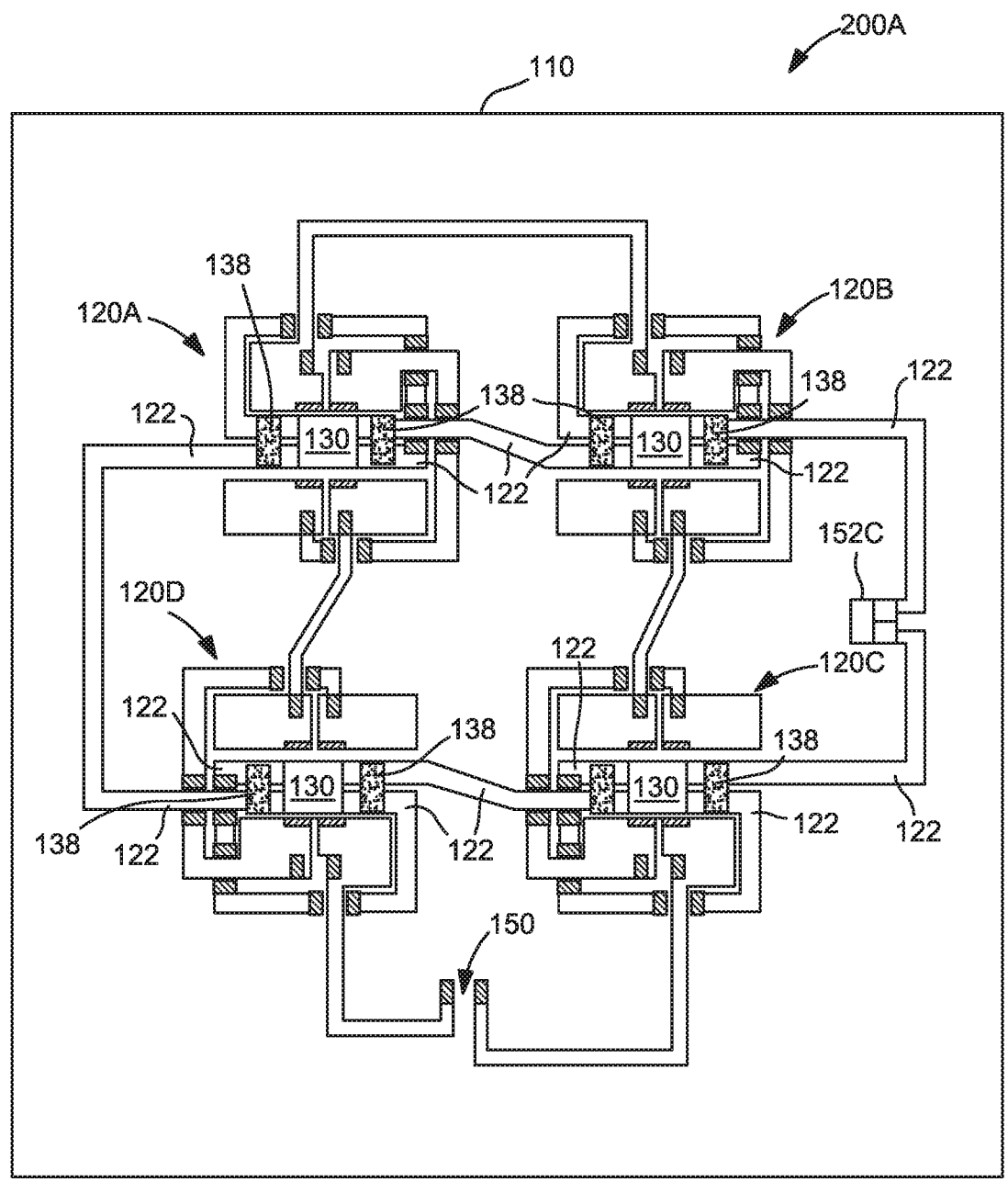

In a first example embodiment, shown in FIG. 6B, a first configuration for a circuit system, generally designated 200A, is shown. In this embodiment, the second voltage connection 152 is connected, via a second electrical connector 152C, to supply a first voltage (e.g., 6V) to a plurality (e.g., four) of first LEDs 130, each of which is populated, along with a plurality of connection components 138, on a respective one of the circuits 120A-D, as shown, for example, in FIG. 2, with a first (e.g., smaller) LED 130 connected to the first set of solder pads of each of circuits 120A-D (see, e.g., 132, FIGS. 1A, 1B). In such a manner, each of the plurality of circuits 120A-D has the same LED (e.g., first LED 130) and is operating at a same voltage.

Figure 6C:
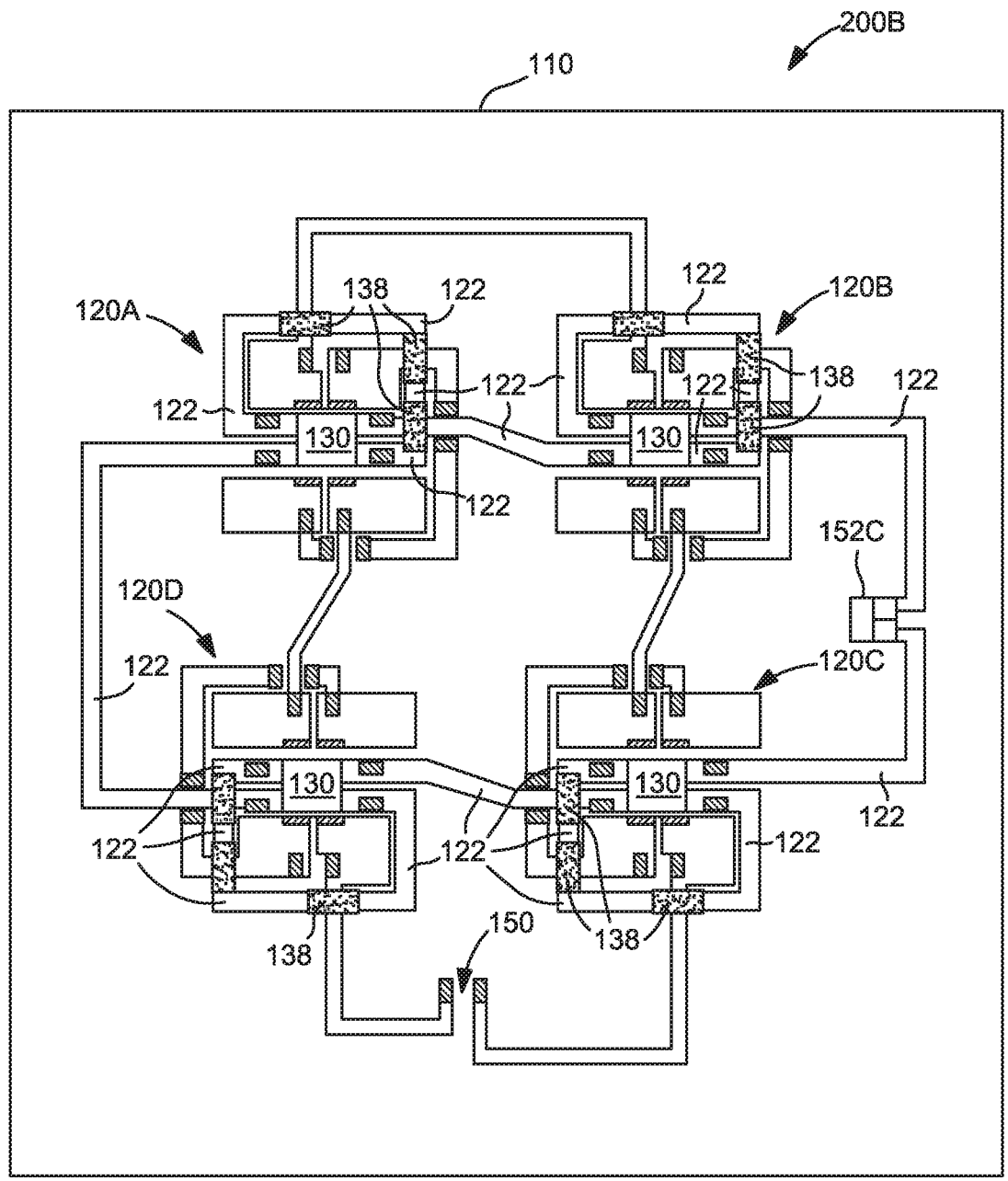

In a second example embodiment shown in FIG. 6C, a second configuration for a circuit system, generally designated 200B, is shown. In this embodiment, the second voltage connection 152 is connected, via a second electrical connector 152C, to supply a second voltage (e.g., 12V) to a plurality (e.g., four) of first LEDs 130, each of which is populated, along with a plurality of connection components 138, on a respective one of the circuits 120A-D, as shown, for example, in FIG. 4, with a first (e.g., smaller) LED 130 connected to the first set of solder pads of each of circuits 120A-D (see, e.g., 132, FIGS. 1A, 1B). In such a manner, each of the plurality of circuits 120A-D has the same LED (e.g., first LED 130) and is operating at a same voltage, which is, in this embodiment, double the voltage of the first example embodiment shown in FIG. 6B.

Figure 6D:
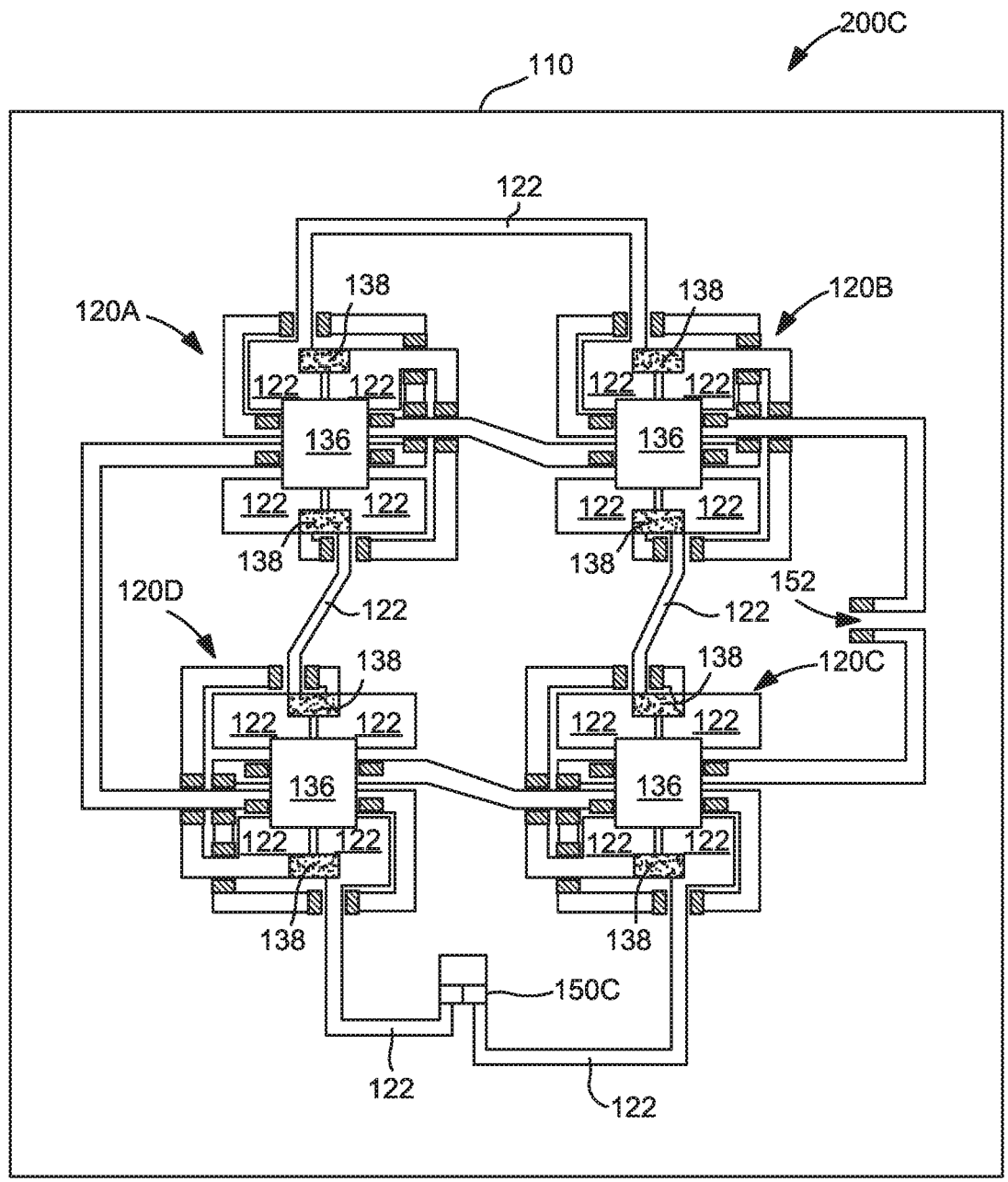

In a third example embodiment, shown in FIG. 6D, a third configuration for a circuit system, generally designated 200C, is shown. In this embodiment, the first voltage connection 150 is connected, via a first electrical connector 150C, to supply a first voltage (e.g., 6V) to a plurality (e.g., four) of second LEDs 136, each of which is populated, along with a plurality of connection components 138, on a respective one of the circuits 120A-D, as shown, for example, in FIG. 3, with a second (e.g., larger) LED 136 connected to the second set of solder pads of each of circuits 120A-D (see, e.g., 134, FIGS. 1A, 1C). In such a manner, each of the plurality of circuits 120A-D has the same (e.g., second LED 136) LED and is operating at a same voltage.

Figure 6E:
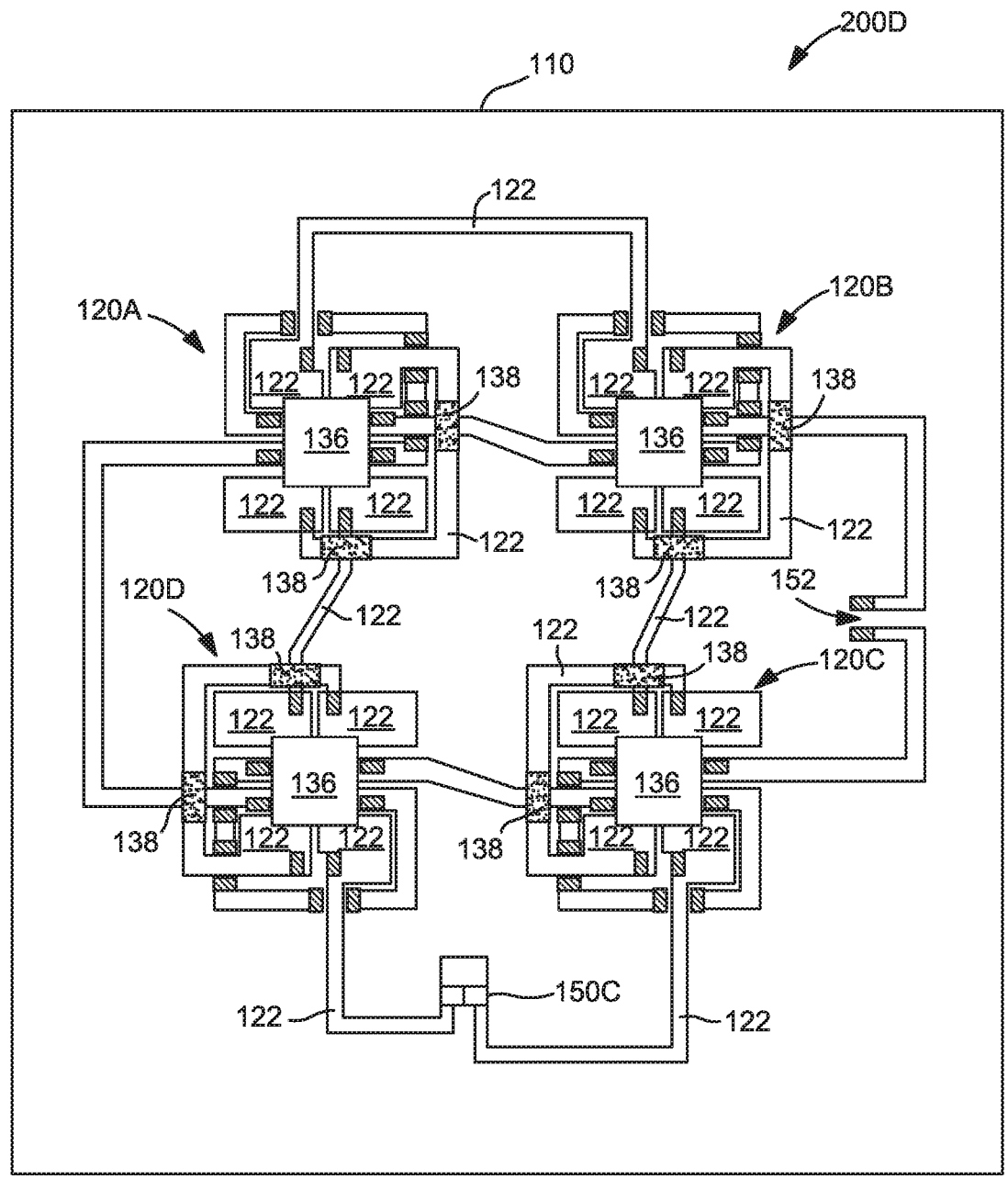

In a fourth example embodiment, shown in FIG. 6E, a fourth configuration for a circuit system, generally designated 200D, is shown. In this embodiment, the first voltage connection 150 is connected, via a first electrical connector 150C, to supply a second voltage (e.g., 12V) to a plurality (e.g., four) of second LEDs 136, each of which is populated, along with a plurality of connection components 138, on a respective one of the circuits 120A-D as shown, for example, in FIG. 5, with a second (e.g., larger) LED 136 connected to the second set of solder pads of each of circuits 120A-D (see, e.g., 134, FIGS. 1A, 1C). In such a manner, each of the plurality of circuits 120A-D has the same (e.g., second LED 136) LED and is operating at a same voltage, which is, in this embodiment, double the voltage of the third example embodiment shown in FIG. 6D.

In another aspect, a method for connecting one of a plurality of differently sized light emitting diodes (LEDs) on a substrate according to any of the embodiments described herein is provided. In some embodiments, the method comprises providing a circuit. The circuit comprises a first set of electrical traces, at least some of which terminate at a first set of solder pads configured for electrical connection to a first sized LED; a second set of electrical traces, at least some of which terminate at a second set of solder pads configured for electrical connection to a second sized LED that is different from the first sized LED, and a plurality of peripheral electrical traces for providing electrical interconnection between electrical traces of the first set of electrical traces or between electrical traces of the second set of electrical traces, wherein the plurality of peripheral electrical traces comprise a plurality of peripheral solder pads for mounting connection components to provide the electrical interconnection between the electrical traces of the first set of electrical traces or between the electrical traces of the second set of electrical traces, respectively. In this embodiment, the method comprises further steps of arranging and connecting the connection components to electrically interconnect the electrical traces of the first set of electrical traces or the electrical traces of the second set of electrical traces, respectively; connecting the first sized LED to the first set of solder pads or the second sized LED to the second set of solder pads; and supplying a first voltage or a second voltage to the first or second sets of electrical traces. The method can further comprise any corresponding steps necessary for using and/or manufacturing any of the device and/or system embodiments, such as are described hereinabove with regard to FIGS. 1A-6.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A device for a light emitting diode (LED), which can at least be a first sized LED or a second sized LED, the second sized LED being a different size from the first sized LED, the device comprising:
    a substrate; and
    a circuit disposed on the substrate and configured to accept both the first sized LED and the second sized LED,
    wherein the circuit comprises:
        a first set of electrical traces, at least some of which terminate at a first set of solder pads configured for electrical connection to the LED when the LED is the first sized LED;
        a second set of electrical traces, at least some of which terminate at a second set of solder pads configured for electrical connection to the LED when the LED is the second sized LED; and
        a plurality of peripheral electrical traces for providing electrical interconnection between electrical traces of the first set of electrical traces or between electrical traces of the second set of electrical traces, wherein the plurality of peripheral electrical traces comprise a plurality of peripheral solder pads for mounting connection components to provide the electrical interconnection between the electrical traces of the first set of electrical traces or between the electrical traces of the second set of electrical traces, respectively, and
    wherein the device is configurable to provide one of at least a first voltage and a second voltage to the LED, regardless of whether the LED is the first sized LED or the second sized LED.

2. The device of claim 1, wherein the second voltage is double a magnitude of the first voltage.

3. The device of claim 1, wherein the connection components comprise at least one of a zero-ohm resistor, a wirebond, and a jumper.

4. The device of claim 1, wherein the first set of electrical traces and the second set of electrical traces each comprise four traces.

5. The device of claim 4, comprising:
    a first connection component disposed to electrically connect together two adjacent traces of the first set of electrical traces or the second set of electrical traces on a first side of the LED; and
    a second connection component disposed to electrically connect together two adjacent traces of the first set of electrical traces or the second set of electrical traces on a second side of the LED,
    wherein the first side of the LED is opposite the second side of the LED.

6. The device of claim 5, wherein the first connection component and the second connection component are configured for connection to the first set of electrical traces to supply the first voltage to the first set of electrical traces.

7. The device of claim 6, wherein the LED is the first sized LED, wherein the first sized LED is a 5 mm square LED, and wherein the first voltage comprises approximately 6V.

8. The device of claim 5, wherein the first connection component and the second connection component are configured for connection to the second set of electrical traces to supply the first voltage to the second set of electrical traces.

9. The device of claim 8, wherein the LED is the second sized LED, wherein the second sized LED is a 7 mm square LED, and wherein the first voltage comprises approximately 6V.

10. The device of claim 4, comprising three connection components configured to electrically connect two electrical traces of the first set of electrical traces, via at least two of the plurality of peripheral electrical traces, and to supply the second voltage to the first set of electrical traces.

11. The device of claim 10, wherein the LED is the first sized LED, wherein the first sized LED is a 5 mm square LED, and wherein the second voltage comprises approximately 12V.

12. The device of claim 4, comprising two connection components configured to electrically connect two electrical traces of the second set of electrical traces, via at least a third of the plurality of peripheral electrical traces, and to supply the second voltage to the second set of electrical traces.

13. The device of claim 12, wherein the LED is the second sized LED, wherein the second sized LED is a 7 mm square LED, and wherein the second voltage comprises approximately 12V.

14. The device of claim 1, comprising a solder mask disposed over at least a portion of the circuit.

15. The device of claim 1, further comprising an electrically isolated, thermally conductive element disposed below the LED.

16. A system for attaching a plurality of LEDs, the system comprising:
    a substrate; and
    a plurality of circuits that are arranged on an upper surface of the substrate and configured to accept a respective one of the plurality of LEDs,
    wherein each of the plurality of circuits comprises:
        a first set of electrical traces, at least some of which terminate at a first set of solder pads configured for electrical connection to a first sized LED of the plurality of LEDs;
        a second set of electrical traces, at least some of which terminate at a second set of solder pads configured for electrical connection to a second sized LED of the plurality of LEDs, wherein the second sized LED is a different size from the first sized LED; and
        a plurality of peripheral electrical traces for providing electrical interconnection between electrical traces of the first set of electrical traces or between electrical traces of the second set of electrical traces, wherein the plurality of peripheral electrical traces comprise a plurality of peripheral solder pads for mounting connection components to provide the electrical interconnection between the electrical traces of the first set of electrical traces or between the electrical traces of the second set of electrical traces, respectively, and wherein the system is configurable to provide one of at least a first voltage and a second voltage to each of the plurality of LEDs.

17. The system of claim 16, wherein the plurality of circuits are electrically connected to each other.

18. A method for connecting light emitting diode (LED), which can at least be a first sized LED or a second sized LED, the second sized LED being a different size from the first sized LED, on a substrate, the method comprising:
  providing a circuit configured to accept both the first sized LED and the second sized LED on the substrate, wherein the circuit comprises:
    a first set of electrical traces, at least some of which terminate at a first set of solder pads configured for electrical connection to the LED when the LED is the first sized LED;
    a second set of electrical traces, at least some of which terminate at a second set of solder pads configured for electrical connection to the LED when the LED is the second sized LED; and
    a plurality of peripheral electrical traces for providing electrical interconnection between electrical traces of the first set of electrical traces or between electrical traces of the second set of electrical traces, wherein the plurality of peripheral electrical traces comprise a plurality of peripheral solder pads for mounting connection components to provide the electrical interconnection between the electrical traces of the first set of electrical traces or between the electrical traces of the second set of electrical traces, respectively;
  arranging and connecting the connection components to electrically interconnect the electrical traces of the first set of electrical traces or the electrical traces of the second set of electrical traces, respectively;
  connecting the first sized LED to the first set of solder pads or the second sized LED to the second set of solder pads; and
  supplying a first voltage or a second voltage to one of at least the first set of electrical traces, when the LED is the first sized LED and is connected to the first set of solder pads, or the second set of electrical traces, when the LED is the second sized LED and is connected to the second set of solder pads.

* * * * *